United States Patent
Morales et al.

(10) Patent No.: US 6,500,757 B1
(45) Date of Patent: Dec. 31, 2002

(54) METHOD AND APPARATUS FOR CONTROLLING GRAIN GROWTH ROUGHENING IN CONDUCTIVE STACKS

(75) Inventors: Guarionex Morales; Jeffrey A. Shields, both of Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/705,938

(22) Filed: Nov. 3, 2000
(Under 37 CFR 1.47)

(51) Int. Cl.⁷ .............................................. H01L 21/44
(52) U.S. Cl. ...................... 438/653; 438/656; 438/660; 438/688
(58) Field of Search ................................ 438/653, 656, 438/660, 688

(56) References Cited

U.S. PATENT DOCUMENTS

| | | | |
|---|---|---|---|
| 5,171,642 A | * 12/1992 | DeHaven et al. ........... 428/620 |
| 5,427,666 A | * 6/1995 | Mueller et al. ......... 204/192.17 |
| 5,572,071 A | * 11/1996 | Lee ............................. 257/751 |
| 5,627,102 A | * 5/1997 | Shinriki et al. ............. 438/653 |
| 5,738,917 A | 4/1998 | Besser et al. ............... 427/576 |
| 5,747,361 A | * 5/1998 | Ouellet ....................... 438/653 |
| 5,789,315 A | 8/1998 | Besser et al. ............... 438/624 |
| 5,843,843 A | * 12/1998 | Lee et al. .................... 438/688 |
| 5,888,899 A | 3/1999 | Paranjpe ..................... 438/625 |
| 6,156,646 A | * 12/2000 | Ishihara ...................... 438/652 |
| 6,255,212 B1 | * 7/2001 | Sandhu et al. .............. 438/652 |

* cited by examiner

*Primary Examiner*—T. N. Quach
(74) *Attorney, Agent, or Firm*—Foley & Lardner

(57) ABSTRACT

An integrated circuit designed to control grain growth induced roughening in a conductive stack is disclosed herein. The conductive stack includes an interconnect metallization layer formed at a low diffusivity temperature of less than 200° C. The interconnect metallization layer includes aluminum doped with copper. The conductive stack further includes subsequent depositions and/or processing involving interconnect metallization layer to be carried out at the low diffusivity temperatures.

24 Claims, 4 Drawing Sheets

D857

D857

US 6,500,757 B1

METHOD AND APPARATUS FOR CONTROLLING GRAIN GROWTH ROUGHENING IN CONDUCTIVE STACKS

FIELD OF THE INVENTION

The present invention relates to conductive stacks for interconnects and methods of manufacturing conductive stacks. More particularly, the present invention relates to a conductive stack, such as a metal stack, resistant to grain growth roughening.

BACKGROUND OF THE INVENTION

Device sizes and geometries associated with integrated circuits have become increasingly smaller. Smaller device sizes and geometries allow integrated circuits to achieve greater densities, faster speeds, and lower power consumption. Reducing device sizes and geometries necessitates the use of more precisely dimensioned circuit interconnects. Circuit interconnects or conductive lines are generally utilized to connect semiconductive or conductive structures within the integrated circuit. Presently, interconnects for integrated circuits include multiple layers to create conductive (e.g., metal) stacks.

A conductive stack (e.g., a metal one layer, a metal two layer, a metal three layer, or a metal four layer) including aluminum (Al) or aluminum alloys, also referred to as an aluminum stack, is generally comprised of an aluminum metallization layer sandwiched between conductive underlayers and overlayers. Conductive underlayers include a titanium (Ti) underlayer and a titanium nitride (TiN) underlayer. Conductive overlayers include a titanium (Ti) overlayer and a titanium nitride (TiN) overlayer. The aluminum metallization layer includes aluminum material doped with copper (Cu). The TiN underlayer is disposed over the Ti underlayer, and the aluminum metallization layer (e.g., aluminum line) is disposed over the TiN underlayer. The Ti overlayer is disposed over the aluminum metallization layer, and the TiN overlayer is disposed over the Ti overlayer. This conductive stack is then masked and etched to form a plurality of interconnects, each interconnect configured to be an electrically isolated aluminum line for carrying a unique current.

In conventional conductive stack fabrication, it is extremely difficult to achieve perfect grain structure or crystallographic texture of the aluminum alloy deposited to form the aluminum metallization layer. Generally, the aluminum metallization layer will include various crystalline imperfections or defects such as grain boundaries. Grain boundaries make the aluminum lines more susceptible to electromigration.

To reduce the electromigration problem, conductive underlayers, such as the Ti and TiN underlayers, and copper doping of aluminum are implemented. The conductive underlayers reduce electromigration by improving the grain structure and grain size, i.e., the crystalline structure, of the aluminum metallization layer such that less grain boundaries are formed. The copper doping of aluminum reduces electromigration when copper undergoes theta (θ) phase precipitation to form $CuAl_2$, a sub-stoichiometric alloy, along the grain boundaries instead of being uniformly distributed throughout the aluminum alloy. These copper precipitates retard grain boundary diffusion, thereby decreasing total mass transport to reduce electromigration.

Although copper precipitates can reduce electromigration, it can also cause micromasking, leading to uneven etching and even shorting of two or more aluminum lines. Aluminum alloys with copper levels above one percent in weight are difficult to etch. The etch chemistry used to etch aluminum alloys essentially cannot etch pure copper or even a high concentration (e.g., two percent) of copper (such as is found at the grain boundaries). Thus, when the aluminum alloy is being etched, high copper concentration sites are seen as micromasks such that nothing will be etched below it or will only partially etch below it. Undesirable residues at the high copper concentration sites can make the etched surface rough. Furthermore, these residues can inadvertently bridge two or more aluminum lines causing interconnects to short circuit (e.g., be inadvertently connected).

Thus, there is a need for an integrated circuit including a conductive stack that is resistant to grain growth induced roughening and micromasking. Further still, there is a need for a method of manufacturing a conductive stack that is resistant to grain growth induced roughening and micromasking. Even further still, there is a need for an aluminum line interconnect that is resistant to copper precipitation and lithography problems associated therewith.

SUMMARY OF THE INVENTION

One exemplary embodiment relates to an integrated circuit including a conductive stack. The conductive stack includes an interconnect metallization layer comprising an aluminum-copper alloy, wherein the interconnect metallization layer is formed at a low diffusivity temperature of the aluminum-copper alloy to minimize undesirable copper precipitation.

Another exemplary embodiment relates to an integrated circuit. The integrated circuit includes a device, an interlevel dielectric layer, and a conductive stack. The interlevel dielectric layer is disposed over the device and the conductive stack is disposed over the interlevel dielectric layer to form an interconnect line of the device. The conductive stack is partially formed at a processing temperature less than 200° C. to provide resistance to grain growth induced roughening and interconnect line bridging.

Still another exemplary embodiment relates to a method of manufacturing an integrated circuit. The method includes providing an interconnect metallization layer over an interlevel dielectric layer at a low diffusivity temperature to form a conductive stack. The method further includes providing an overlayer over the interconnect metallization layer at the low diffusivity temperature to further form the conductive stack. The method still further includes processing the conductive stack after providing an overlayer step at the low diffusivity temperature when the interconnect metallization layer would otherwise be thermally affected, to minimize residue formation.

BRIEF DESCRIPTION OF THE DRAWINGS

Exemplary embodiments will hereinafter be described with reference to the accompanying drawings, wherein like numerals denote like elements, and.

DETAILED DESCRIPTION OF THE PREFERRED EXEMPLARY EMBODIMENTS

FIGS. 1–4 illustrate an advantageous integrated circuit (IC) fabrication process. The process is capable of forming a conductive stack including an aluminum-copper alloy that is resistant to copper theta (θ) phase precipitation and thus less susceptible to grain growth induced roughening and micromasking. The process can be utilized to fabricate various types of ICs that include aluminum line interconnects, including processors, logic circuit, dynamic random access memory, static random access memory, or other devices.

Figure 1:
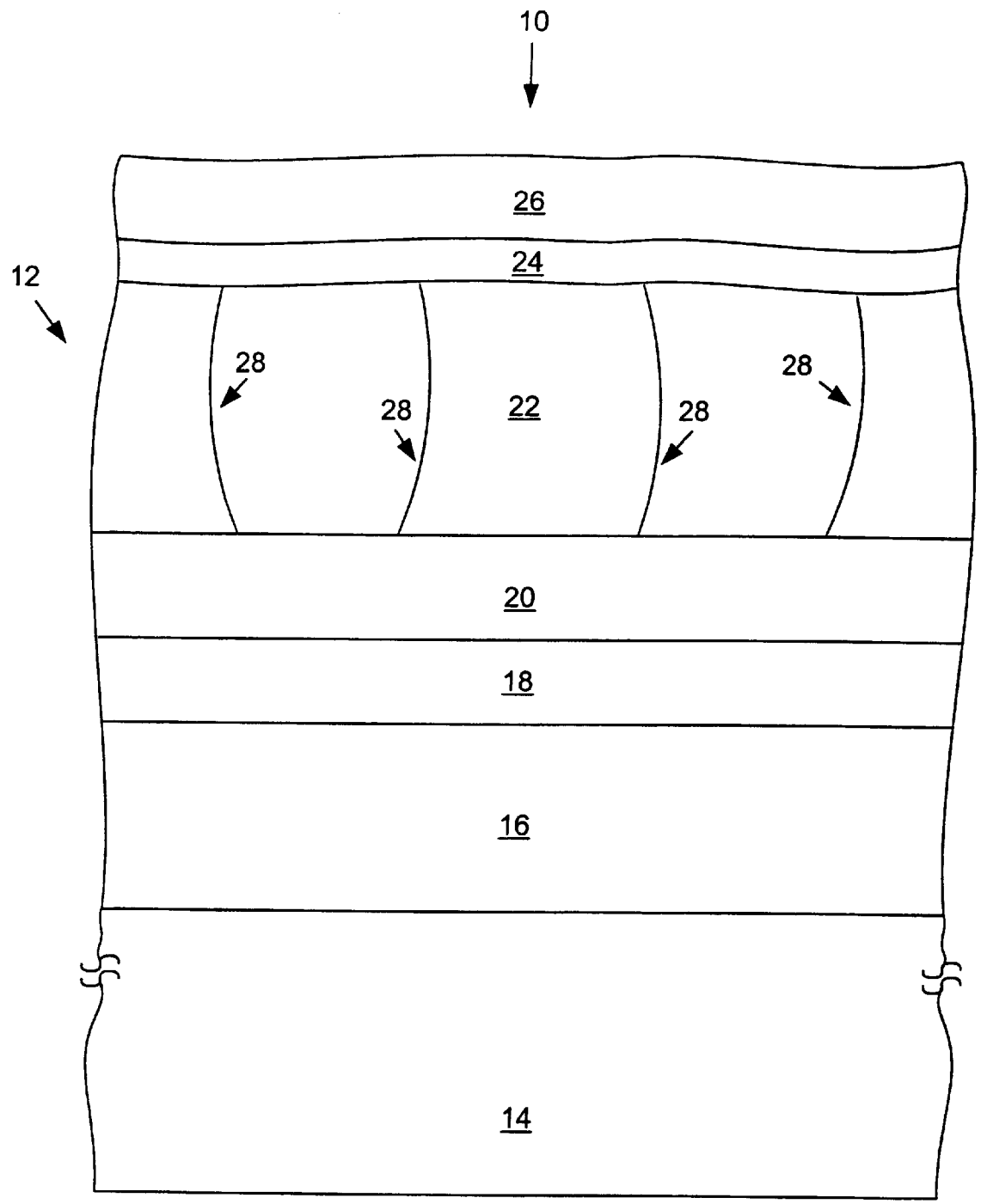
FIG. 1 is a cross-sectional view of a portion of an integrated circuit including a conductive stack in accordance with an exemplary embodiment.

Referring to FIG. 1, a portion 10 of an integrated circuit can be any type of electrical device or part thereof. Preferably, portion 10 includes conductive (e.g., metal) stacks used to form circuit interconnects, such as a conductive stack 12. Portion 10 includes a substrate 14, an interlevel dielectric layer 16, and conductive stack 12. Interlevel dielectric layer 16 is disposed over substrate 14, and conductive stack 12 is disposed over interlevel dielectric layer 16.

Although not shown, one or more devices may be disposed between substrate 14 and interlevel dielectric layer 16. Devices can include bi-polar or filed effect transistors, flash transistors, diodes, resistors, capacitors, or other structures. Moreover, a multilevel metallization scheme, i.e., plurality of sets of conductive stacks and interlevel dielectric layers, may be provided on portion 10 to maximize packing density on the integrated circuit.

Substrate 14 is preferably a single crystal material, such as a single crystal silicon wafer. Alternatively, substrate 18 can be a bulk substrate, an epitaxial layer, a gallium arsenide (GaAs) material, a silicon-on-insulator substrate, or other semi-conductive material.

Interlevel dielectric layer 16 (also referred to as ILD) is deposited by a conventional process such as plasma enhanced chemical vapor deposition (PECVD). Interlevel dielectric layer 16 (e.g., ILDO) can be silicon dioxide, boron phosphorous silicate glass (BPSG), or other insulative material. Alternatively, interlevel dielectric layer 16 may be a stack formation of combinations of silicon dioxide, BPSG, or other insulative layers.

Conductive stack 12 includes a first conductive underlayer 18, a second conductive underlayer 20, an interconnect metallization layer 22, a first conductive overlayer 24, and a second conductive overlayer 26. Second conductive underlayer 20 is disposed over the first conductive underlayer 18, and the interconnect metallization layer 22 is disposed over the second conductive underlayer 20. First conductive overlayer 24 is disposed over the interconnect metallization layer 22, and the second conductive overlayer 26 is disposed over the first conductive overlayer 24.

Although not shown, portion 10 will be further processed to form conductive lines, each conductive line capable of carrying a different current or signal. For example, conductive stack 12 and interlevel dielectric layer 16 may be patterned and etched to form, among others, via holes and these via holes may then be filled with a conductive material to form via plugs.

Figure 2:
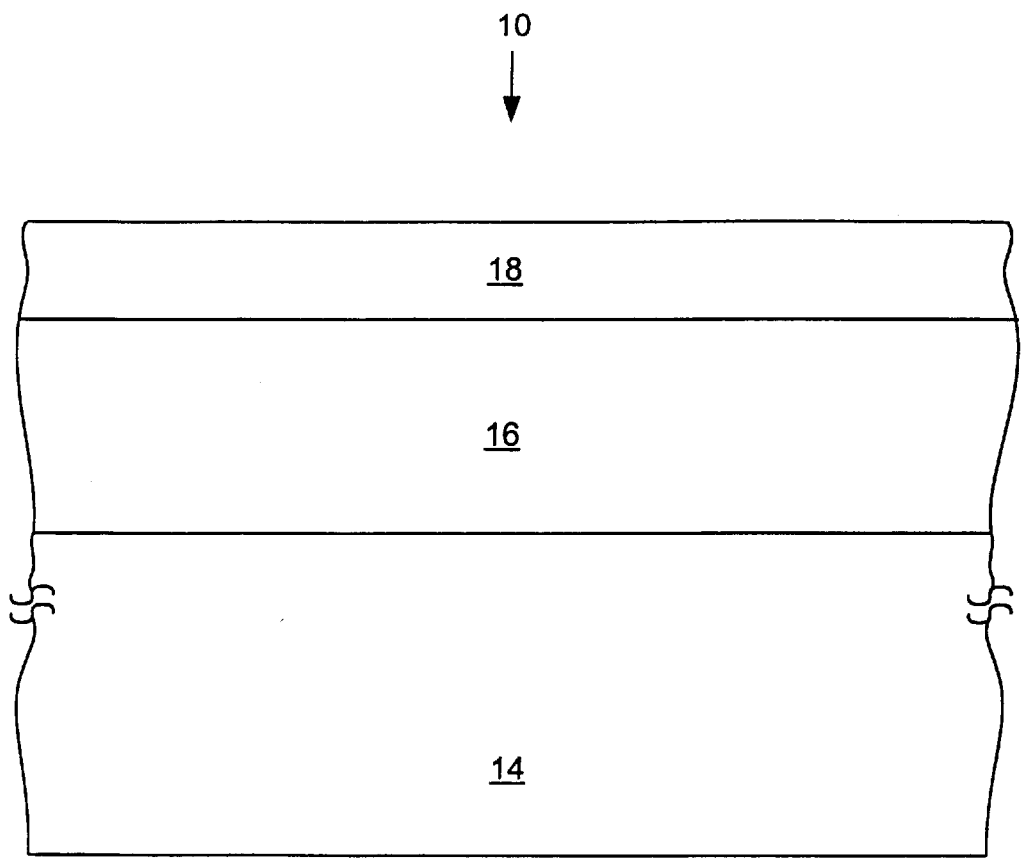
FIG. 2 is a cross-sectional view of the portion of the integrated circuit illustrated in FIG. 1, showing a first conductive underlayer deposition step.

Referring to FIGS. 1–4, the fabrication of portion 10 is described below. In FIG. 2, first conductive underlayer 18 is formed over interlevel dielectric layer 16. First conductive underlayer 18 is preferably titanium (Ti). First conductive underlayer 18 is deposited by physical vapor deposition (PVD) to a deposition thickness in the range of 100 to 500 Angstrom (Å), preferably to a thickness of approximately 250 Å. Alternatively, first conductive underlayer 18 may be other conductive materials having similar crystal lattice structure and physical characteristics as Ti.

Figure 3:
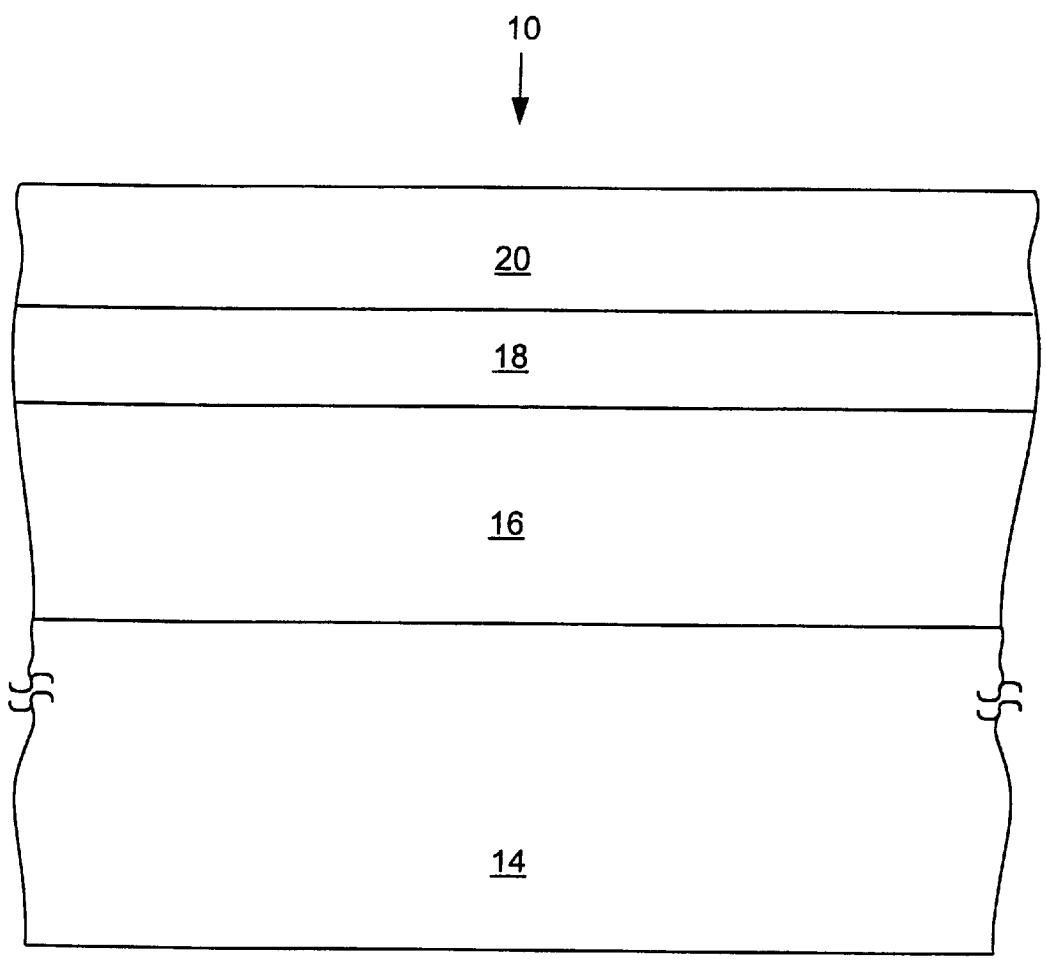
FIG. 3 is a cross-sectional view of the portion of the integrated circuit illustrated in FIG. 2, showing a second conductive underlayer deposition step.

In FIG. 3, second conductive underlayer 20 is formed over first conductive underlayer 18. Second conductive underlayer 20 is preferably titanium nitride (TiN). Second conductive underlayer 20 is deposited by PVD with a titanium target and nitrogen provided in the chamber during the deposition process. Second conductive underlayer 20 is deposited at 150 to 250° C. to a deposition thickness in the range of 300 to 500 Å. Alternatively, second conductive underlayer may be other conductive materials having similar crystal lattice structure and physical characteristics as TiN.

Underlayers 18, 20 are selected to provide a suitable base upon which interconnect metallization layer 22 will be oriented in a desirable crystal orientation with minimal amount of crystal defects. As such, it should be understood that instead of two underlayers, such as underlayers 18, 20, the underlayer structure may alternatively comprise one or more layers as is necessary to improve the crystalline structure of interconnect metallization layer 22 and to provide other benefits such as reduction in contact resistance.

Figure 4:
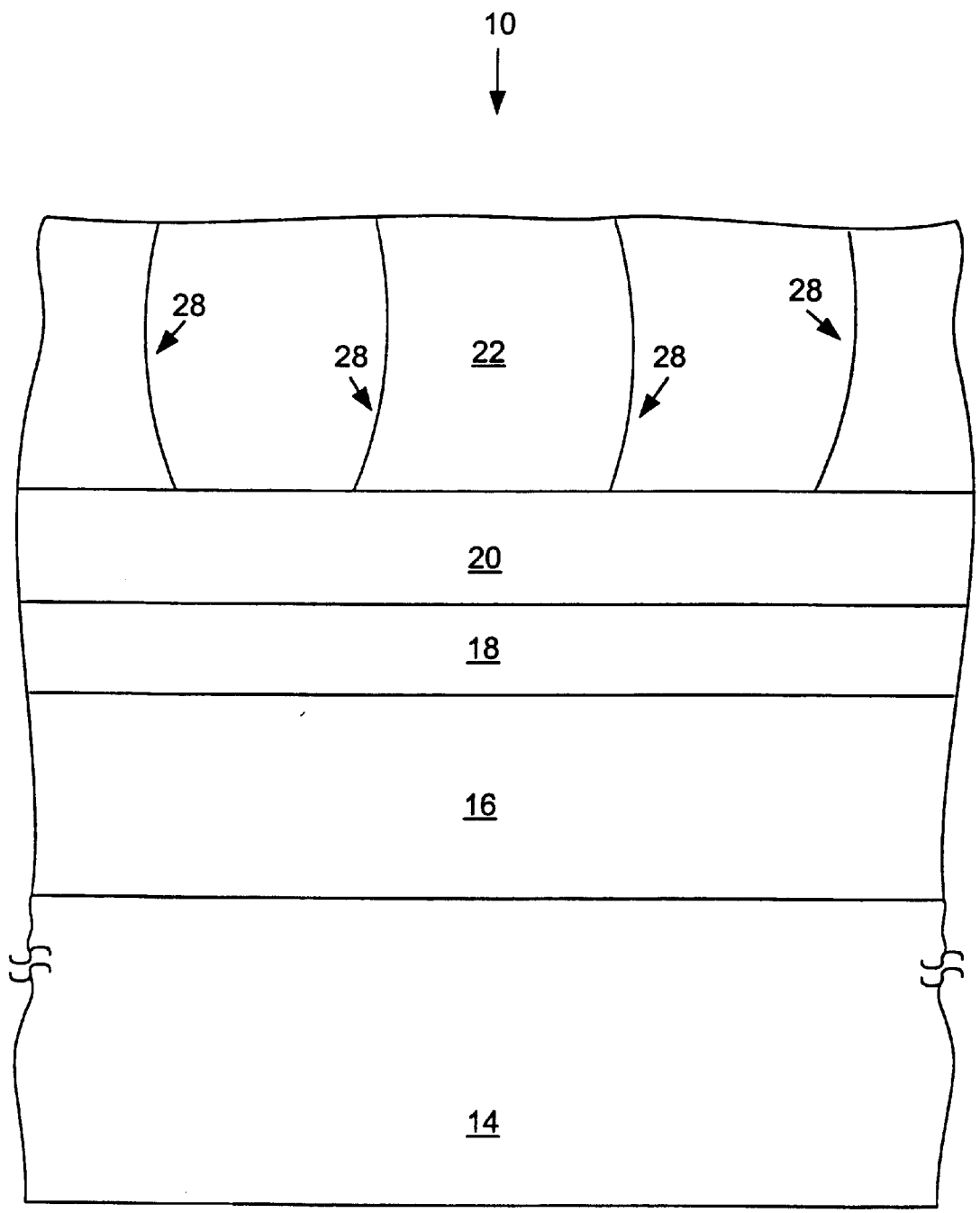
FIG. 4 is a cross-sectional view of the portion of the integrated circuit illustrated in FIG. 3, showing an interconnect metallization deposition step.

In FIG. 4, interconnect metallization layer 22 is formed over second conductive underlayer 20. Interconnect metallization layer 22 is preferably aluminum doped with 0.1 to 1.5% copper by weight, and more preferably 1% copper by weight. Interconnect metallization layer 22 is deposited by a physical vapor deposition (PVD) process at less than 200° C., preferably at 120 to 180° C., most preferably at 150 to 180° C., to a deposition thickness of 4000 to 8000 Å. The aluminum-copper alloy has a predominantly <111> crystal orientation with grain boundaries 28.

By depositing interconnect metallization layer 22 within the low diffusivity range for aluminum-copper alloy, i.e., at temperatures under 200° C., copper theta (θ) phase precipitation is reduced, which results in a decrease in or resistance to residue formation and grain growth roughening. As shown in FIG. 4,, although grain boundaries 28 are present in interconnect metallization layer 22, grain boundary hillock formation has been minimized such that the top surface of interconnect metallization layer 22, and indirectly overlayers 24, 26 (see FIG. 1), are relatively smooth. Resistance to copper precipitation is further provided by maintaining later fabrication processes that could effect interconnect metallization layer 22, such as deposition of overlayers 24, 26 and thermal processing after interconnect metallization layer 22 deposition, within the low diffusivity range.

Returning to FIG. 1, first conductive overlayer 24 is formed over interconnect metallization layer 22. First conductive overlayer 24 is preferably Ti. First conductive overlayer 24 is deposited by PVD at 120 to 180° C. to a deposition thickness of approximately 150 Å.

Second conductive overlayer 26 is formed over first conductive overlayer 24. Second conductive overlayer 26 is preferably TiN. Second conductive overlayer 26 is deposited by PVD at 120 to 180° C. to a deposition thickness in the range of 350 to 1000 Å.

Overlayers 24, 26 serve several functions, including: (1) serving as an anti-reflective coating (ARC) to enhance lithographic resolution;. (2) serving as a barrier/adhesion/ nucleation film to protect the interconnect metallization layer 22 from damaging interactions with chemicals or other materials (such as oxidation of the aluminum alloy) used in subsequent processing steps; and (3) serving to reduce the contact resistance of conductive stack 12. Thus, overlayers 24, 26 may be other conductive materials capable of providing one or more desirable properties above. Moreover, it should be understood that overlayers 24, 26 may alternatively comprise one layer or more than two layers as is necessary to provide the benefits above.

In this manner, a Ti/TiN/Al/Ti/TiN conductive stack with aluminum alloy deposition and subsequent processings performed in the low diffusivity range of aluminum-copper alloy provides resistance to copper precipitation, thereby minimizing micromasking, residue formation, grain growth roughening, and aluminum line shorts. Thus, there can be more leniency in the critical dimension (CD), or separation distance, required between adjacent aluminum lines to prevent bridging because there should be less residues to cause bridging.

It is understood that, while preferred exemplary embodiments, examples, materials, and values are given, they are for the purpose of illustration only. The apparatus and method of the invention are not limited to the precise details and conditions disclosed. For example, interconnect metallization layer 22 may be of different thickness then above and other methods of deposition may be utilized. Thus, various changes may be made to the details disclosed without departing from the spirit of the invention, which is defined by the following claims.

What is claimed is:

1. A method of manufacturing an integrated circuit, comprising:

(a) providing an interconnect metallization layer over an interlevel dielectric layer at a low diffusivity temperature to form a conductive stack;

(b) providing an overlayer over the interconnect metallization layer at the low diffusivity temperature to further form the conductive stack; and (c) processing the conductive stack after the providing step (b) at the low diffusivity temperature when the interconnect metallization layer would otherwise be thermally affected, to minimize residue formation.

2. The method of claim 1, wherein the low diffusivity temperature is in the range of 120 to 180° C.

3. The method of claim 1, wherein the interconnect metallization layer includes aluminum doped with 0.1 to 1.5% copper by weight.

4. The method of claim 1, wherein the interconnect metallization layer includes aluminum doped with approximately 1% copper by weight.

5. The method of claim 1, further comprising providing an underlayer disposed between the interlevel dielectric layer and the interconnect metallization layer to further form the conductive stack.

6. The method of claim 5, wherein at least one of the underlayer and overlayer is a conductive material selected from a group consisting of titanium, a titanium alloy, an anti-reflective material, and a contact resistance reducing material.

7. A method of manufacturing an integrated circuit, the integrated circuiting comprising a conductive stack disposed on an interlevel dielectric layer, the conductive stack including an interconnect metallization layer comprising an aluminum-copper alloy, wherein the interconnect metallization layer is formed at a low diffusivity temperature of the aluminum-copper alloy to minimize undesirable copper precipitation, the method comprising steps of:

(a) providing the interconnect metallization layer over the interlevel dielectric layer at a low diffusivity temperature to form the conductive stack;

(b) providing an overlayer over the interconnect metallization layer at the low diffusivity temperature to further form the conductive stack; and (c) processing the conductive stack after the providing step (b) at the low diffusivity temperature when the interconnect metallization layer would otherwise be thermally affected, to minimize residue formation.

8. The method of claim 7, wherein the conductive stack further includes an underlayer and an additional overlayer.

9. The method of claim 8, wherein the additional overlayer is formed at the low diffusivity temperature.

10. The method of claim 8, wherein the underlayer is disposed over the interlevel dielectric layer, the interconnect metallization layer is disposed over the underlayer, and the overlayer is disposed over the interconnect metallization layer.

11. The method of claim 8, wherein the underlayer is a compound layer including a first conductive underlayer and a second conductive underlayer, and the overlayer is a first conductive overlayer and the additional overlayer is a second conductive overlayer.

12. The method of claim 11, wherein the first conductive underlayer includes titanium.

13. The method of claim 11, wherein the second conductive underlayer and the second conductive overlayer each include titanium nitride.

14. The method of claim 7, wherein the low diffusivity temperature is in the range of 120 to 180° C.

15. The method of claim 7, wherein the interconnect metallization layer includes aluminum doped with 0.1 to 1.5% copper by weight.

16. The method of claim 7, wherein the interconnect metallization layer includes aluminum doped with approximately 1% copper by weight.

17. A method of manufacturing a device for an integrated circuit, the integrated circuit including an interlevel dielectric layer disposed over the device and a conductive stack disposed over the interlevel dielectric layer to form an interconnect line of the device, wherein the conductive stack is partially formed at a processing temperature less than 200° C. to provide resistance to grain growth induced roughening and interconnect line bridging, the method comprising:

(a) providing the interconnect metallization layer over the interlevel dielectric layer at a low diffusivity temperature to form the conductive stack;

(b) providing an overlayer over the interconnect metallization layer at the low diffusivity temperature to further form the conductive stack; and (c) processing the conductive stack after the providing step (b) at the low diffusivity temperature.

18. The method of claim 17, wherein the conductive stack includes the interconnect metallization layer and an additional overlayer.

19. The method of claim 18, wherein the interconnect metallization layer is 4000 to 8000 Å thick.

20. The method of claim 18, wherein the interconnect metallization layer includes aluminum doped with copper and the overlayer includes a conductive material selected from a group consisting of titanium, a titanium alloy, and an anti-reflective material.

21. The method of claim 20, wherein the interconnect metallization layer includes aluminum doped with 0.1 to 1.5% copper by weight.

22. The method of claim 21, wherein the interconnect metallization layer includes aluminum doped with approximately 1% copper by weight.

23. The method of claim 22, wherein the processing temperature includes a low diffusivity temperature of aluminum-copper alloy.

24. The method of claim 23, wherein the processing temperature includes a range of 120 to 180° C.

* * * * *